United States Patent
da Fonseca

(10) Patent No.: US 10,090,766 B2
(45) Date of Patent: Oct. 2, 2018

(54) REUSING ELECTROMAGNETIC ENERGY FROM A VOLTAGE CONVERTER DOWNHOLE

(71) Applicant: HALLIBURTON ENERGY SERVICES, INC., Houston, TX (US)

(72) Inventor: Fernando Oliveira da Fonseca, Worcestershire (GB)

(73) Assignee: Halliburton Energy Services, Inc., Houston, TX (US)

(*) Notice: Subject to any disclaimer, the term of this patent is extended or adjusted under 35 U.S.C. 154(b) by 18 days.

(21) Appl. No.: 15/118,806

(22) PCT Filed: Nov. 11, 2015

(86) PCT No.: PCT/US2015/060060
§ 371 (c)(1),
(2) Date: Aug. 12, 2016

(87) PCT Pub. No.: WO2017/082888
PCT Pub. Date: May 18, 2017

(65) Prior Publication Data
US 2017/0271992 A1    Sep. 21, 2017

(51) Int. Cl.
*H02M 3/335*    (2006.01)
*H02M 3/28*    (2006.01)
(Continued)

(52) U.S. Cl.
CPC ..... *H02M 3/33507* (2013.01); *E21B 41/0085* (2013.01); *H02M 1/08* (2013.01);
(Continued)

(58) Field of Classification Search
CPC ............ H02M 3/33569; H02M 3/338; H02M 3/3381; H02M 3/3385; H03K 17/0822;
(Continued)

(56) References Cited

U.S. PATENT DOCUMENTS 5,347,929 A    9/1994 Lerche et al.
5,418,702 A *   5/1995 Marinus ............... H02M 3/335
                                                363/131
(Continued)

FOREIGN PATENT DOCUMENTS

CN    202475263    10/2012
EP    2775598    9/2014
(Continued)

OTHER PUBLICATIONS

International Patent Application No. PCT/US2015/060060, International Search Report and Written Opinion, dated Aug. 5, 2016, 9 pages.

*Primary Examiner* — Harry Behm
(74) *Attorney, Agent, or Firm* — Kilpatrick Townsend & Stockton LLP

(57) ABSTRACT

A biasing circuit for a flyback converter can include a rectifier electrically coupled to an inductor of the flyback converter for generating a direct current signal from an alternating current signal outputted by the inductor in response to the inductor transferring an amount of energy to another inductor. The biasing circuit can also include a storage device electronically coupled to the rectifier to receive the direct current signal and store a charge. The biasing circuit can further include a limiting device electronically coupled to the storage device to provide an amount of the charge that is stored in the storage device to an input lead of a switch of the flyback converter for biasing the switch.

20 Claims, 7 Drawing Sheets

(51) Int. Cl.

| | | |
|---|---|---|
| *H02M 1/08* | (2006.01) | |
| *H03K 17/082* | (2006.01) | |
| *H03K 17/10* | (2006.01) | |
| *H03K 17/16* | (2006.01) | |
| *E21B 41/00* | (2006.01) | |
| *H02M 1/00* | (2006.01) | |
| *E21B 47/00* | (2012.01) | |

(52) U.S. Cl.
CPC .......... *H02M 3/28* (2013.01); *H03K 17/0822* (2013.01); *H03K 17/102* (2013.01); *H03K 17/165* (2013.01); *E21B 47/00* (2013.01); *H02M 2001/0048* (2013.01); *H03K 2217/0036* (2013.01); *H03K 2217/0081* (2013.01)

(58) Field of Classification Search
CPC .. H03K 17/0826; H03K 17/082; H03K 17/08; G05F 1/595
See application file for complete search history.

(56) References Cited

U.S. PATENT DOCUMENTS

| | | | |
|---|---|---|---|
| 5,602,724 A | 2/1997 | Balakrishnan | |
| 6,320,332 B1* | 11/2001 | Weber | H04N 3/233 |
| | | | 315/370 |
| 7,307,390 B2 | 12/2007 | Huynh et al. | |
| 7,345,894 B2 | 3/2008 | Sawtell et al. | |
| 7,522,431 B2 | 4/2009 | Huynh et al. | |
| 7,911,814 B2 | 3/2011 | Tao et al. | |
| 2007/0070659 A1* | 3/2007 | Sawtell | H02M 3/33523 |
| | | | 363/21.01 |
| 2007/0188957 A1* | 8/2007 | Weng | H02M 1/34 |
| | | | 361/91.7 |
| 2009/0097281 A1* | 4/2009 | Lin | H02M 3/33569 |
| | | | 363/21.18 |
| 2009/0196076 A1 | 8/2009 | Danstrom et al. | |
| 2009/0295349 A1* | 12/2009 | Tao | H02M 3/33507 |
| | | | 323/282 |
| 2010/0309689 A1* | 12/2010 | Coulson | H02M 3/33507 |
| | | | 363/16 |
| 2011/0199796 A1 | 8/2011 | Wu et al. | |
| 2011/0261594 A1* | 10/2011 | Joshi | H02M 3/33569 |
| | | | 363/21.12 |
| 2012/0268074 A1* | 10/2012 | Cooley | H01G 11/58 |
| | | | 320/130 |
| 2014/0035627 A1* | 2/2014 | Dunipace | H03K 3/012 |
| | | | 327/109 |
| 2014/0177280 A1* | 6/2014 | Yang | H02M 3/33523 |
| | | | 363/15 |
| 2015/0162906 A1* | 6/2015 | Phadke | H03K 17/0422 |
| | | | 327/109 |

FOREIGN PATENT DOCUMENTS

| | | |
|---|---|---|
| JP | 09163732 | 6/1997 |
| JP | 09168279 | 6/1997 |
| JP | 2000156976 | 6/2000 |
| JP | 2008161031 | 7/2008 |
| KR | 1020120081002 | 7/2012 |
| WO | 9740575 | 10/1997 |
| WO | 2014095201 | 6/2014 |

* cited by examiner

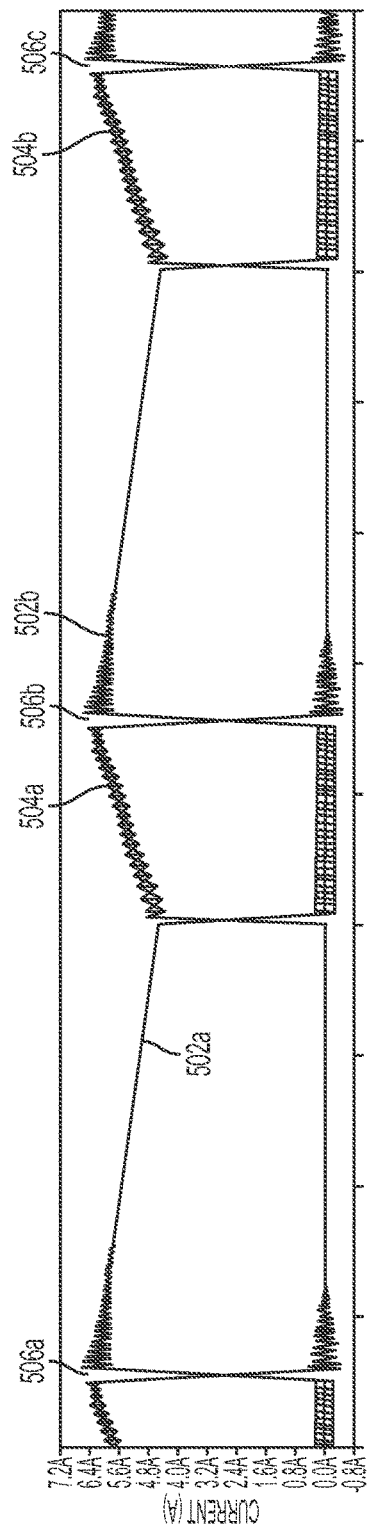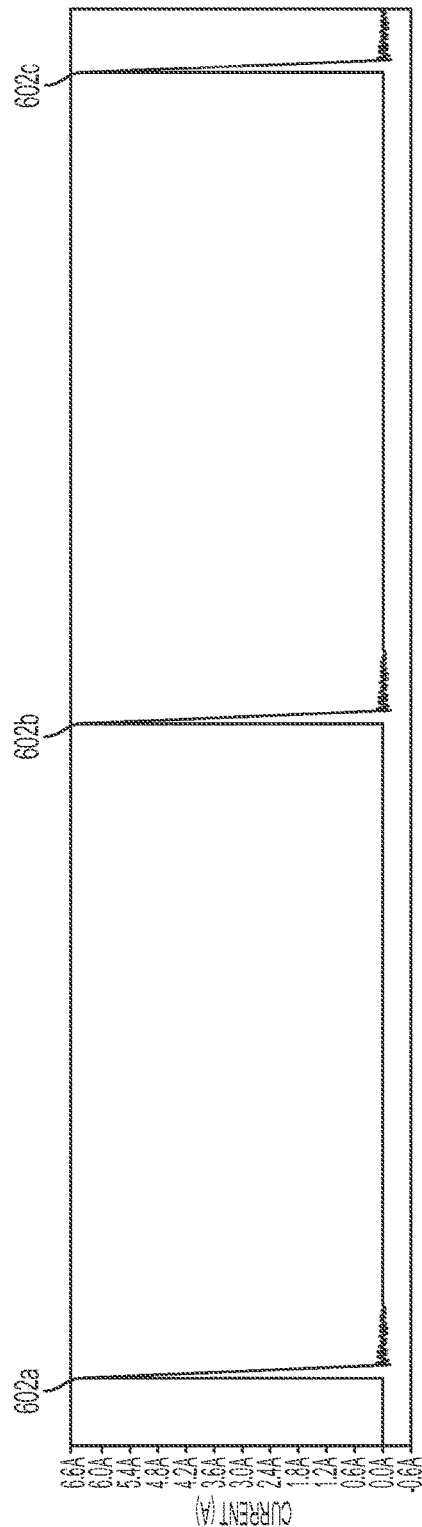
FIG. 5
FIG. 6

REUSING ELECTROMAGNETIC ENERGY FROM A VOLTAGE CONVERTER DOWNHOLE

CROSS-REFERENCE TO RELATED APPLICATIONS

This is a U.S. national phase under 35 U.S.C. 371 of International Patent Application No. PCT/US2015/060060, titled "Reusing Electromagnetic Energy from a Voltage Converter Downhole" and filed Nov. 11, 2015, the entirety of which is incorporated herein by reference.

TECHNICAL FIELD

The present disclosure relates generally to devices for use in well systems. More specifically, but not by way of limitation, this disclosure relates to reusing electromagnetic energy from a voltage converter downhole.

BACKGROUND

A well system (e.g., an oil or gas well for extracting fluid or gas from a subterranean formation) can include various sensors. For example, a well system can include sensors for measuring well system parameters, such as temperature, pressure, resistivity, or sound levels. Different sensors can use different amounts of voltage to operate. For example, a temperature sensor can use 1.5 volts to operate, while a pressure sensor can use 5 volts to operate.

It can be desirable to use the same power source to supply voltage to multiple sensors. Voltage converters can be used to convert an amount of voltage output by the power source to the different amounts of voltage used by the sensors. It can be challenging to convert the voltage output by the power source to a different amount of voltage efficiently.

BRIEF DESCRIPTION OF THE DRAWINGS

FIG. 5 is a graph depicting current through inductors of a voltage converter downhole according to some aspects.

FIG. 6 is a graph depicting current through a diode in a biasing circuit for reusing electromagnetic energy from a voltage converter downhole according to some aspects.

DETAILED DESCRIPTION

Figure 1A:
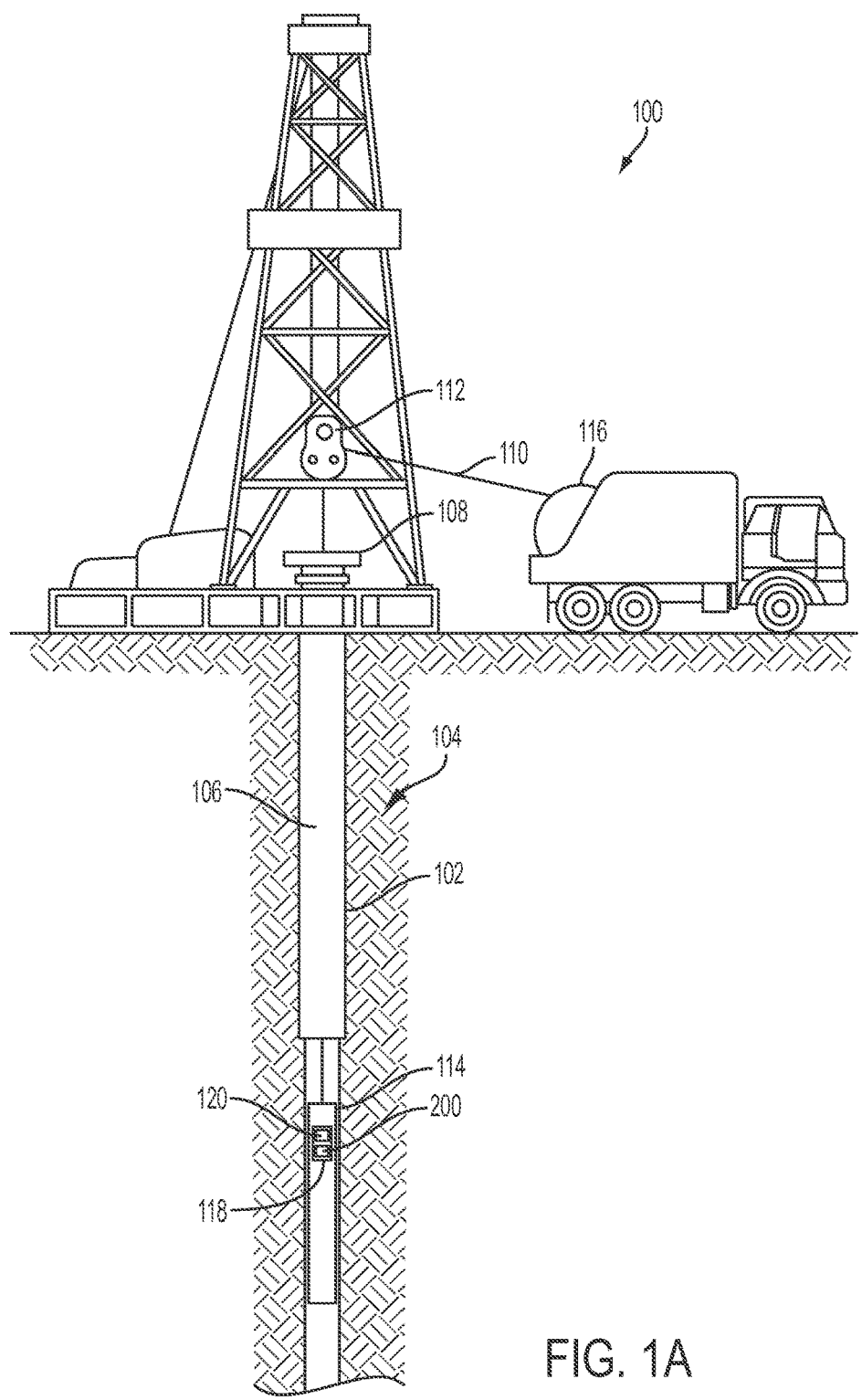
FIG. 1A is a cross-sectional view of an example of a well system that includes a system for reusing electromagnetic energy from a voltage converter downhole according to some aspects.

Certain aspects and features of the present disclosure relate to reusing electromagnetic energy from a voltage converter downhole. The voltage converter can include a flyback converter. The voltage converter can convert an input voltage to a different output voltage (e.g., that is greater or less than the input voltage). In some examples, the voltage converter can include a primary side for receiving the input voltage and a secondary side for transmitting the output voltage to a load. The primary side can include a primary inductor magnetically coupled to a secondary inductor of the secondary side. In some examples, the voltage converter can generate an electromagnetic surge upon the primary inductor transferring stored energy to the secondary inductor. The electromagnetic surge can generate a power spike in the primary side. A biasing circuit of the voltage converter can capture the energy from the power spike and reuse the energy to bias a switch.

The biasing circuit can include a rectifier coupled to the primary inductor. An example of the rectifier can be a diode. The rectifier can convert an alternating current (AC) signal of the power spike to a direct current (DC) signal. The rectifier can transmit the DC signal to a storage device. An example of the storage device can include two capacitors in a voltage divider configuration. The storage device can receive the DC signal and store an associated charge. The biasing circuit can also include a limiting device. An example of the limiting device can include a resistor. The limiting device can provide a path through which an amount of the charge stored in the storage device can flow to the switch. The limiting device can limit the amount of power provided to the switch. In some examples, the biasing circuit can include the switch. An example of the switch can include one or more transistors. For example, the switch can include a bipolar junction transistor (BJT) in a cascaded configuration with a metal-oxide-semiconductor field effect transistor (MOSFET). The biasing circuit can capture the energy associated with the electromagnetic surge and reuse the energy to bias the switch.

In some examples, the voltage converter can have a reduced number of components by reusing the power to bias the switch. This can lead to a reduced cost, complexity, and size of the voltage converter. Additionally, the voltage converter can have reduced noise and increased reliability as compared to a system drawing the biasing current from other portions of a circuit with which the voltage converter is integrated.

In some examples, the biasing circuit can also include a second limiting device electrically coupled in parallel with the storage device. The second limiting device can prevent the storage device from overcharging.

In some examples, the switch can locally store a small amount of excess charge in response to the switch repeatedly switching on and off. The biasing circuit can include a second rectifier electrically coupled in parallel to the limiting device for allowing the excess charge to flow to an electrical ground. This can allow the excess charge to dissipate from the switch. Removing the excess charge can allow the switch to switch on and off with a high frequency.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1A is a cross-sectional view of an example of a well system 100 that includes a system 118 for reusing electromagnetic energy from a voltage converter 200 downhole according to some aspects. The well system 100 includes a wellbore 102 extending through various earth strata. The wellbore 102 extends through a hydrocarbon bearing subterranean formation 104. At times, a casing string 106 can extend from the surface 108 to the subterranean formation 104. The casing string 106 can provide a conduit through which formation fluids, such as production fluids produced from the subterranean formation 104, can travel from the wellbore 102 to the surface 108. In some examples, a cement sheath can couple the casing string 106 to a wall of the wellbore 102.

The well system 100 can also include at least one well tool 114 (e.g., a formation-testing tool). The well tool 114 can be coupled to a wireline 110, slickline, or coiled tube that can be deployed into the wellbore 102. The wireline 110, slickline, or coiled tube can be guided into the wellbore 102 using, for example, a guide 112 or winch. In some examples, the wireline 110, slickline, or coiled tube can be wound around a reel 116.

The well system 100 (e.g., well tool 114) can include the system 118 for reusing electromagnetic energy from a voltage converter 200. In some examples, the voltage converter 200 can include a flyback converter. The system 118 can use the electromagnetic energy from the voltage converter 200 to bias a switch 120. In some examples, the switch 120 can be an integrated component of the voltage converter 200. The voltage converter 200 can generate an extraneous surge of electromagnetic energy while operating. The system 118 can store voltage generated from the surge of electromagnetic energy. The system 118 can use the stored voltage to bias the switch 120.

Figure 1B:
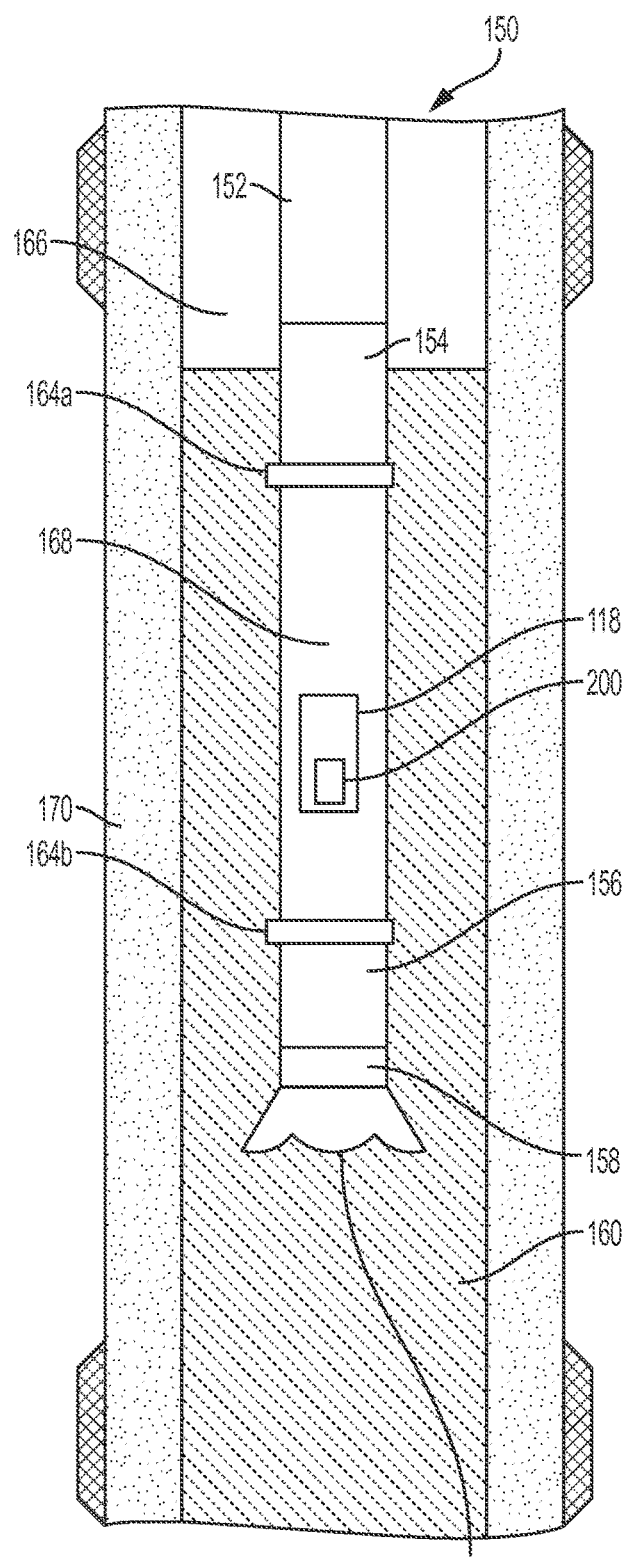
FIG. 1B is a cross-sectional view of an example of a well system that includes a system for reusing electromagnetic energy from a voltage converter downhole according to some aspects.

FIG. 1B is a cross-sectional view of an example of a well system 150 that includes a system 118 for reusing electromagnetic energy from a voltage converter 200 (e.g., a flyback converter) downhole according to some aspects. In this example, the well system 150 includes a wellbore 170. In some examples, the wellbore 170 can include fluid 160. An example of the fluid 160 can include mud. The fluid 160 can flow in an annulus 166 positioned between a well tool 152 and a wall of the wellbore 170.

The well tool 152 can be positioned in the wellbore 170. In some examples, the well tool 152 is a logging-while-drilling tool. The well tool 152 can include various subsystems 154, 168, 156, 158. For example, the well tool 152 can include a subsystem 154 that includes a communication subsystem. The well tool 152 can also include a subsystem 156 that includes a saver subsystem or a rotary steerable system. A tubular section or an intermediate subsystem 168 (e.g., a mud motor or measuring-while-drilling module) can be positioned between the other subsystems 154, 156. In some examples, the well tool 152 can include a drill bit 162 for drilling the wellbore. The drill bit 162 can be coupled to another tubular section or intermediate subsystem 158 (e.g., a measuring-while-drilling module or a rotary steerable system). In some examples, the well tool 152 can include tubular joints 164a-b. Tubular joints 164a-b can allow the well tool 152 to bend and/or can couple various well tool subsystems 154, 156, 158 together.

In some examples, the well system 150 can include the system 118. For example, the well tool 152 can include the system 118. The system 118 can include a voltage converter 200. The system 118 can be operable to capture excess electromagnetic energy from the voltage converter 200. The system 118 can use the excess electromagnetic energy to bias a switch (e.g., integrated within the voltage converter 200).

Figure 2:
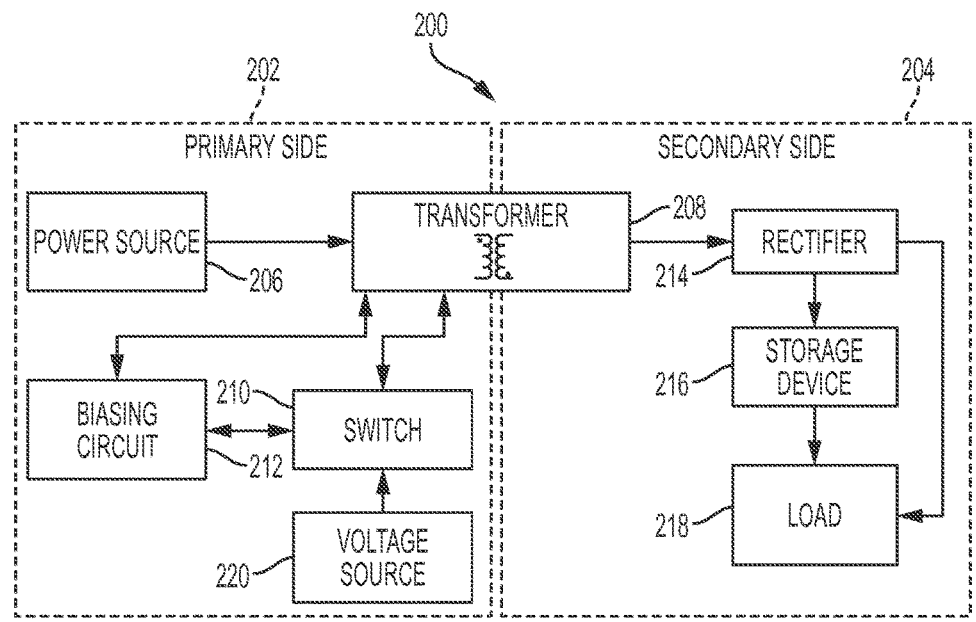
FIG. 2 is a block diagram of an example of a voltage converter that can reuse electromagnetic energy according to some aspects.

FIG. 2 is a block diagram of an example of a voltage converter 200 (e.g., a flyback converter) that can reuse electromagnetic energy according to some aspects. In some examples, the voltage converter 200 can reuse the electromagnetic energy to bias a switch 210. The voltage converter 200 can include a primary side 202 and a secondary side 204.

The primary side 202 can include a power source 206. The power source 206 can include an alternating current (AC) or a direct current (DC) power source 206. The power source 206 can be electrically coupled to a transformer 208 for supplying the transformer 208 with power.

The transformer 208 can magnetically couple the primary side 202 to the secondary side 204. In some examples, the transformer 208 can transfer energy from a primary inductor to a secondary inductor of the transformer 208. This can transfer energy from the primary side 202 to the secondary side 204 (e.g., to step-up or step-down a voltage of the primary side 202). In some examples, the energy transfer can generate a power spike in the primary side 202. A biasing circuit 212 can be coupled to the transformer 208 for storing power from the power spike. The biasing circuit 212 can use the stored power to bias a switch 210. This can allow current to flow through the switch 210.

The transformer 208 and the biasing circuit 212 can be electrically coupled to the switch 210. In some examples, the switch 210 can include a field effect transistor, such as a MOSFET. In other examples, the switch 210 can include a BJT. In some examples, the switch 210 can include multiple switches, such as both a MOSFET and a BJT. The switches can be in any suitable configuration, such as a cascaded configuration (e.g., the cascaded configuration depicted in FIG. 4).

The secondary side 204 of the voltage converter 200 can include a rectifier 214. An example of the rectifier 214 can include a diode. The rectifier 214 can receive an AC signal and convert the AC signal to a DC signal. For example, the rectifier 214 can receive the AC signal from the transformer 208 and rectify the AC signal into a DC signal. In some examples, the secondary side can include a storage device 216. An example of the storage device 216 can include a capacitor. The storage device 216 can store a portion of the energy from the DC signal. In some examples, the secondary side 204 can include a load 218. An example of the load 218 can include a sensor or an electronic device (e.g., of a well tool). The load 218 can be electrically coupled to the rectifier 214 or the storage device 216. The storage device 216 can supply the load 218 with power when the switch 210 is closed. The switch 210 can be closed when the switch 210 allows current to flow through the primary side 202.

The voltage source 220 can manipulate the switch 210 to operate the voltage converter 200. For example, the voltage source 220 can transmit a signal to the switch 210. An example of the signal can include a square wave. The signal can cause the switch 210 to repeatedly open (e.g., preventing current from flowing through the primary side 202) and close. In some examples, when the switch 210 is closed, the power source 206 can charge the primary inductor of the transformer 208. This can induce a negative voltage in the secondary inductor of the transformer 208. The negative voltage can reverse bias the rectifier 214, preventing current from flowing through the rectifier 214. This can cause the storage device 216 to provide power to the load 218. In some examples, when the switch 210 is open, a voltage in the primary inductor can decrease. This can generate a positive voltage in the secondary inductor of the transformer 208. The positive voltage can forward bias the rectifier 214, allowing current to flow through the rectifier 214. The current can be delivered to storage device 216, which can recharge the storage device 216. The current can also be delivered to the load 218. In this manner, the voltage converter 200 can provide a substantially constant voltage to the load 218. The voltage can be set higher or lower via the voltage source 220.

Figure 3:
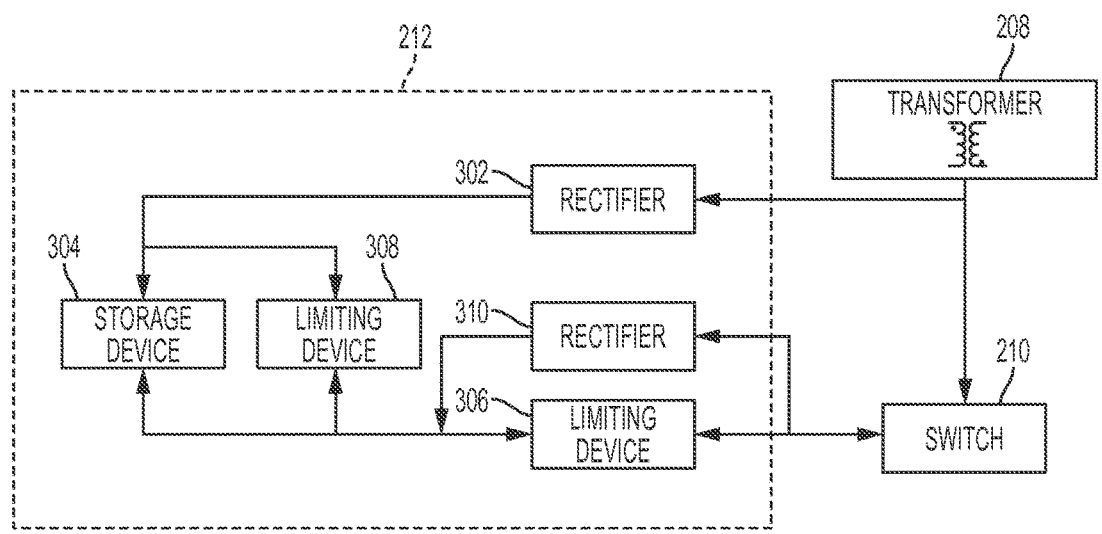
FIG. 3 is a block diagram of an example of a system that includes a biasing circuit that can reuse electromagnetic energy from a voltage converter downhole according to some aspects.

FIG. 3 is a block diagram of an example of a system that includes a biasing circuit 212 that can reuse electromagnetic energy from a voltage converter downhole according to some aspects. The biasing circuit 212 can include a rectifier 302. An example of the rectifier 302 can include one or more diodes. The rectifier 302 can be electrically coupled to the transformer 208. For example, the rectifier 302 can be electrically coupled to a primary inductor of the transformer 208. The rectifier 302 can receive a power spike (e.g., a current spike) from the transformer 208. The rectifier 302 can rectify the power spike and transmit power to a storage device 304.

The biasing circuit 212 can include the storage device 304. An example of the storage device 304 can include one or more capacitors. For example, the storage device 304 can include two capacitors in a voltage divider configuration. The storage device 304 can store a charge upon receiving the power from the rectifier 302.

The biasing circuit 212 can include a limiting device 308. An example of the limiting device 308 can include one or more resistors. In some examples, the limiting device 308 can be configured in parallel to the storage device 304. The limiting device 308 can prevent the storage device 304 from overcharging or otherwise becoming damaged.

In some examples, the biasing circuit 212 can include another limiting device 306. An example of the limiting device 306 can include one or more resistors. The limiting device 306 can provide a path for current to flow from the storage device 304 to the switch 210. The limiting device 306 can limit an amount of current transmitted from the storage device 304 to the switch 210. The limiting device 306 can be electrically coupled to the switch 210 for transmitting power from the storage device 304 to the switch 210. This can bias the switch 210.

In some examples, the biasing circuit 212 can include another rectifier 310. An example of the rectifier 310 can include a diode. The rectifier 310 can be electrically coupled in parallel to the limiting device 306. The rectifier 310 can provide a path from the switch 210 to electrical ground. The path can allow excess charge stored in the switch 210 to dissipate, as described in greater detail with respect to FIG. 4.

Figure 4:
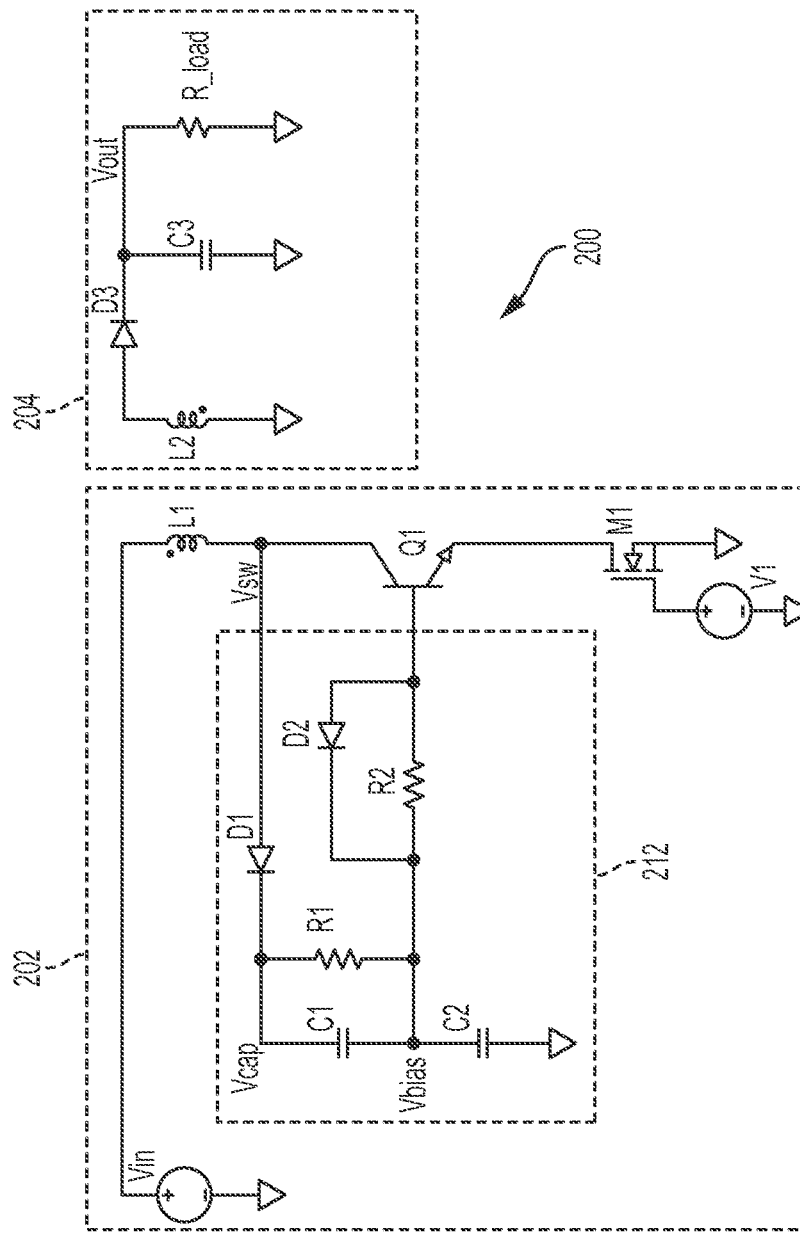
FIG. 4 is a schematic diagram of an example of a voltage converter that can reuse electromagnetic energy according to some aspects.

FIG. 4 is a schematic diagram of an example of a voltage converter 200 that can reuse electromagnetic energy (e.g., to bias a switch) according to some aspects. The voltage converter 200 can include the primary side 202 and the secondary side 204. The primary side 202 can include an inductor L1 and the secondary side 204 can include an inductor L2. Inductor L1 can be magnetically coupled to inductor L2, forming a transformer (e.g., transformer 208 of FIG. 2).

The primary side 202 can include a power source Vin. The power source Vin can supply power to the voltage converter 200 to operate the voltage converter 200. The power source Vin can output DC voltage.

The primary side 202 can include a switch, such as a switching circuit. The switch can include multiple transistors in a cascaded configuration. For example, the switch can include transistor Q1 (e.g., a BJT) in a cascaded configuration with transistor M1 (e.g., a MOSFET). In one example, the emitter from a transistor Q1 can be electrically coupled to the drain of transistor M1 for operating in the cascaded configuration. In some examples, the cascaded transistors can allow for transistor Q1 to perform the power switching, while transistor M1 performs small signal switching. This can improve the performance and speed of the voltage converter 200. For example, such a cascaded configuration can allow the voltage converter 200 to operate at higher switching frequencies. In some examples, transistor Q1, transistor M1, or both can include silicon carbide. Silicon carbide transistors can be more robust and operate well in high temperatures.

The primary side 202 can include a voltage source v1. The voltage source v1 can generate (e.g., via a pulse-width modulator) a square wave, sine wave, or other AC signal for operating the voltage converter 202. The signal can have N volts (e.g., 5 volts) when in a high state. N can be the voltage necessary to allow current to flow between the drain and the source of transistor M1 (e.g., for the transistor M1 to enter a saturation mode). The signal can have less than N volts (e.g., 0 volts) when in a low state.

When the signal is in the high state, current can flow through transistor M1. This can supply an emitter of transistor Q1 with current. In some examples, the transistor Q1 must be properly biased at a base (e.g., have an appropriate biasing current) of the transistor Q1 to allow current to flow between a collector and the emitter of the transistor Q1 (e.g., to allow transistor Q1 to enter a saturation mode). If transistor Q1 is properly biased at the base, current can flow through transistor Q1 and through inductor L1. This can cause inductor L1 to charge. For example, the increasing current slopes 504a-b of FIG. 5 depict the inductor L1 charging while the signal from the voltage source v1 is in the high state. When the signal switches to the low state (e.g., as depicted at points 506a-c of FIG. 5), the energy stored in inductor L1 can transfer to inductor L2. For example, the decreasing current slopes 502a-b of FIG. 5 can show the energy transfer from inductor L1 to inductor L2.

The inductor L2 can receive the energy from inductor L1 and transmit an associated signal to diode D3. Diode D3 can rectify the signal. The diode D3 can transmit the rectified signal to capacitor C3 and load R_Load. In some examples, load R_Load can include a well tool, a sensor, or any other electrical device (e.g., for use in a wellbore).

In some examples, switching the signal (from the voltage source v1) from a high state to a low state (depicted at points 506a-c of FIG. 5) generates an electromagnetic surge. The electromagnetic surge can be due to an intrinsic leakage inductance from inductor L1 and inductor L2 resonating with a combined output capacitance of transistor M1 and transistor Q1. The electromagnetic surge can generate a power spike (e.g., as depicted as current spikes at points 602a-c of FIG. 6) in the voltage converter 200. The biasing circuit 212 can capture the energy from the power spike and reuse the energy to bias the transistor Q1.

The biasing circuit 212 can include a diode D1. The diode D1 can be coupled between the inductor L1 and the collector of the transistor Q1 (at point Vsw). The diode D1 can receive and rectify the power spike generated by the inductor L1. For example, looking at FIGS. 5-6 together, as the signal from the voltage source v1 switches from a high state to a low state at points 506a-c, corresponding current spikes (at points 602a-c) are generated through diode D1. Diode D1 transmits the rectified power (e.g., current spikes) to capacitors C1 and C2.

Capacitors C1 and C2 can store a charge based on the rectified power transmitted by diode D1. In some examples, a resistor R1 can be electrically coupled in parallel across capacitor C1. Resistor R1 can dissipate a remaining portion of the rectified power transmitted by D1. This can prevent capacitors C1 and C2 from overcharging. In some examples, capacitors C1 and C2 can be configured to form a voltage divider. The values of capacitors C1 and C2 can be configured such that the voltage divider generates an appropriate voltage at Vbias for biasing the base of transistor Q1. For example, the voltage at Vcap can be high while the inductor L2 is discharging its stored energy. In the example shown in FIG. 7, the voltage at Vcap is 254.8 volts between points 702 and 704. This voltage can be too high to bias transistor Q1 and may damage transistor Q1. The voltage divider can generate a lower voltage Vbias for biasing transistor Q1. For example, as shown in FIG. 8, the voltage at Vbias can be 9.5 volts between points 802 and 804.

Figure 7:
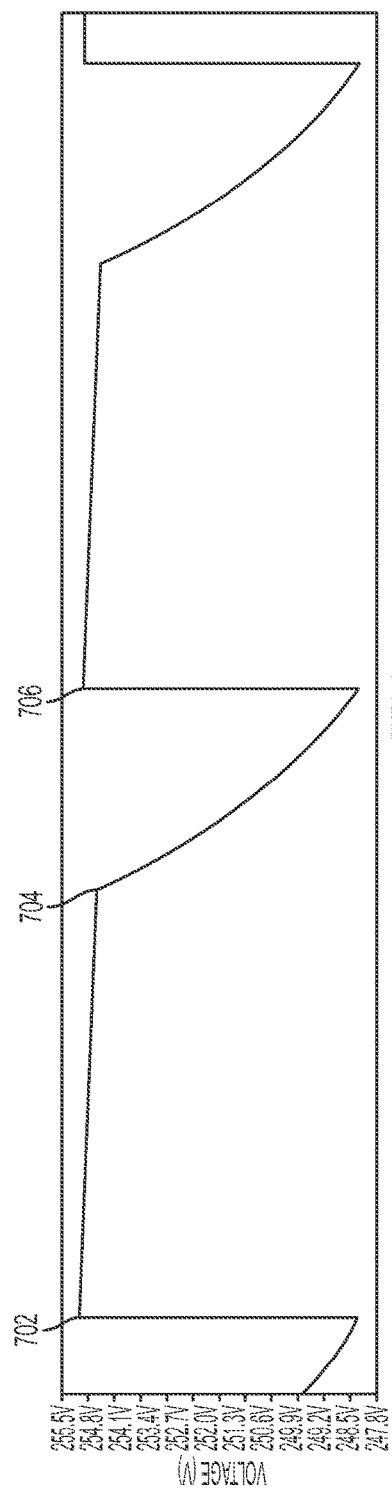
FIG. 7 is a graph depicting voltage at a point in a biasing circuit for reusing electromagnetic energy from a voltage converter downhole according to some aspects.
Figure 8:
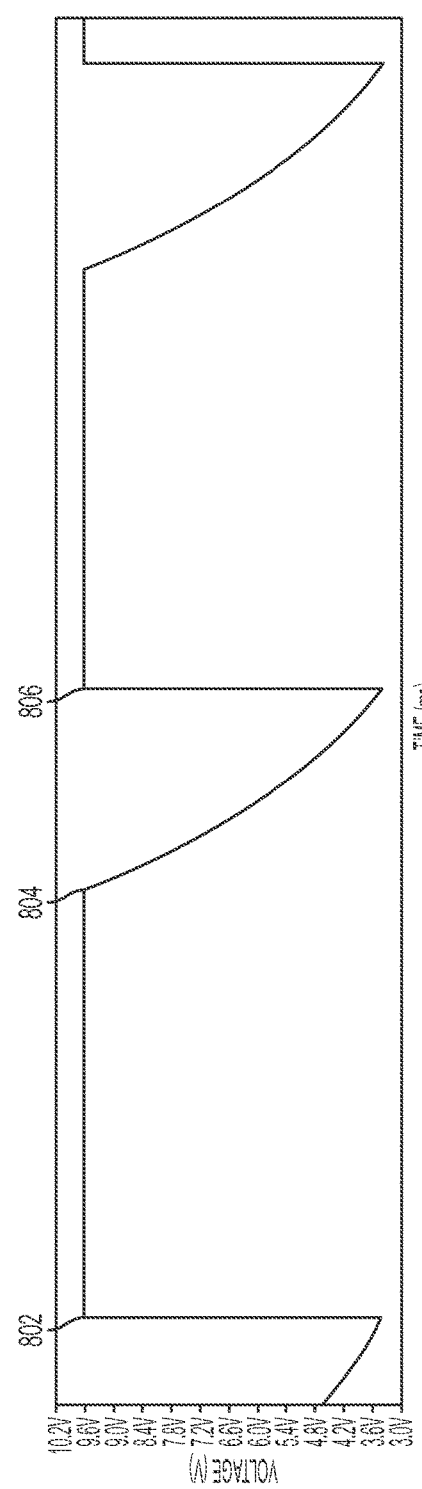
FIG. 8 is a graph depicting voltage at a point in a biasing circuit for reusing electromagnetic energy from a voltage converter downhole according to some aspects.

Looking at FIGS. 7-8 together, upon the signal from the voltage source 220 switching from a high state to a low state, the inductor L1 can transfer its stored energy to inductor L2. This generates the electromagnetic surge, causing the capacitors C1 and C2 to store an associated charge. This can cause the voltages at Vcap (e.g., as shown by the line between point 702 and point 704 of FIG. 7) and Vbias (e.g., as shown by the line between point 802 and point 804 of FIG. 8) to be high. Upon the signal from the voltage source 220 switching from a low state to a high state, the inductor L1 can charge up. This can cause the capacitors C1 and C2 to rapidly discharge their energy, as depicted by the curve between point 704 and point 706 of FIG. 7, and the curve between point 804 and point 806 of FIG. 8. This can cause the voltages at Vbias and Vcap to be low.

In some examples, the biasing circuit 212 can include resistor R2. Resistor R2 can be electrically coupled from the output or node (e.g., Vbias) of the voltage divider between C1 and C2 to the base of the transistor Q1. Resistor R2 can limit the current entering the base of transistor Q1. This can prevent transistor Q1 from overheating or otherwise becoming damaged.

In some examples, the biasing circuit 212 can include diode D2. The diode D2 can be electrically coupled between the base of the transistor Q1 and the output point or node of the voltage divider between C1 and C2. The diode D2 can be electrically coupled in parallel to resistor R2. In some examples, transistor Q1 can locally store a small amount of excess charge in response to the transistor M1 repeatedly switching on and off. Diode D2 can provide a path for allowing the excess charge of transistor Q1 to flow to an electrical ground and dissipate. Removing the excess charge can allow transistor Q1 to switch on and off with a high frequency. Allowing the transistor Q1 to switch on and off with a high frequency can allow the voltage converter 200 to use smaller inductors L1 and L2. This can result in a smaller and cheaper overall voltage converter.

As the voltage converter 200 is operated, the biasing circuit 212 can capture and store energy from electromagnetic surges generated by the inductors L1 and L2. The biasing circuit 212 can reuse the energy to bias the transistor Q1. In some examples, the voltage converter 200 can have a reduced number of components by reusing the power to bias the transistor Q1. This can lead to a reduced cost, complexity, and size of the voltage converter 200. Additionally, the voltage converter 200 can have reduced noise and increased reliability by using the biasing circuit 212 to locally generate the biasing current for transistor Q1, as compared to a system that draws the biasing current from other portions of a circuit with which the voltage converter 200 is integrated.

Figure 9:
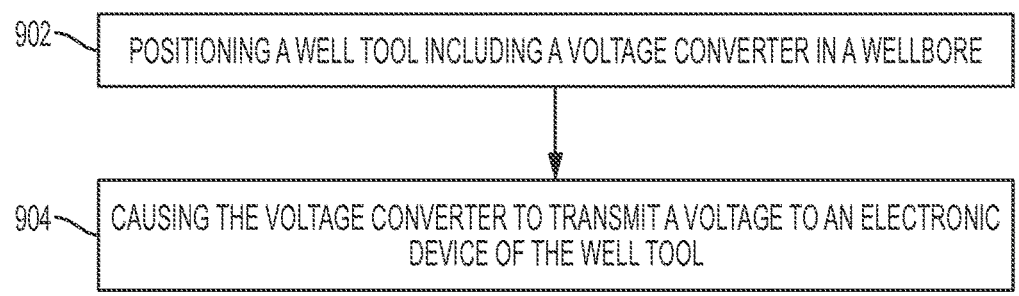
FIG. 9 is a flowchart of an example of a process for using a voltage converter that can reuse electromagnetic energy according to some aspects.

FIG. 9 is a flowchart of an example of a process for using a voltage converter that can reuse electromagnetic energy according to some aspects.

In block 902, a well tool that includes a voltage converter is positioned in a wellbore. The well tool can be positioned in the wellbore by a well operator or user. In some examples, the well tool can be positioning in the wellbore via a wireline, slickline, or coiled tube. For example, the well tool can be lowered into the wellbore via a wireline. In other examples, the well tool can include a drill string on which the voltage converter can be positioned. The drill string can be positioned in the wellbore for performing drilling operations.

In some examples, the voltage converter can be a flyback converter. The voltage converter can include a biasing circuit. The biasing circuit can include any combination of features described herein.

In block 904, a well operator causes the voltage converter to transmit a voltage to an electronic device of the well tool (e.g., to operate the electronic device). For example, the well operator can transmit a wired or wireless signal to the well tool. The well tool can receive the signal and, in response to the signal, operate the voltage converter. For example, the well tool can transmit a signal from a power source, such power source Vin of FIG. 1, to the voltage converter. The well tool can additionally or alternatively transmit another signal from another power source, such as voltage source v1 of FIG. 1, to the voltage converter. The voltage converter can receive the power from the one or more power sources and responsively transmit an amount of voltage to the electronic device. The amount of voltage transmitted to the electronic device can be less than another amount of voltage transmitted to the voltage converter by the one or more power sources.

In some aspects, systems and methods for reusing electromagnetic energy from a voltage converter downhole are provided according to one or more of the following examples:

Example #1

A biasing circuit for a flyback converter can include a rectifier electrically coupled to an inductor of the flyback converter for generating a direct current signal from an alternating current signal outputted by the inductor in response to the inductor transferring an amount of energy to another inductor. The biasing circuit can also include a storage device electronically coupled to the rectifier to receive the direct current signal and store a charge. The biasing circuit can additionally include a limiting device electronically coupled to the storage device to provide an amount of the charge that is stored in the storage device to an input lead of a switch of the flyback converter for biasing the switch.

Example #2

The biasing circuit of Example #1 may feature the rectifier including a diode, the storage device including a capacitor, the limiting device including a resistor, the inductor including a part of a transformer, the switch including a transistor, and the input lead including a base of the transistor.

Example #3

The biasing circuit of Example #2 may feature the storage device including two capacitors in a voltage divider configuration. The limiting device can electrically couple an output node of the voltage divider configuration to the base of a transistor.

Example #4

The biasing circuit of any of Examples #2-3 may feature a second transistor. An emitter of the transistor can be electrically coupled to a drain of second transistor.

Example #5

The biasing circuit of Example #4 may feature the transistor including a bipolar-junction transistor (BJT) and the second transistor including a metal-oxide-semiconductor field effect transistor (MOSFET). The BJT, the MOSFET, or both can include silicon carbide.

Example #6

The biasing circuit of any of Examples #1-5 may feature a second limiting device that can be electrically coupled in parallel with the storage device for preventing the storage device from overcharging.

Example #7

The biasing circuit of any of Examples #1-6 may feature a primary side of the flyback converter including the biasing circuit and being operable to receive an input voltage. The primary side can be magnetically coupled to a secondary side of the flyback converter via a transformer. The secondary side can be operable to transmit an output voltage that is different than the input voltage to a load comprising a sensor.

Example #8

The biasing circuit of any of Examples #1-7 may feature the flyback converter including a primary side and a secondary side. The primary side can include the rectifier, the inductor, the storage device, and the limiting device. The secondary side can be coupled to a load that can include an electronic device of a well tool.

Example #9

The biasing circuit of any of Examples #1-8 may feature the biasing circuit being positioned on a well tool.

Example #10

A system for use in a wellbore can include a flyback converter and a transformer. The transformer can be for magnetically coupling a primary side of the flyback converter to a secondary side of the flyback converter and for generating a power spike in response to a primary inductor of the transformer transferring an amount of energy to a secondary inductor of the transformer. The primary side can be operable to receive an input voltage and the secondary side operable to output an output voltage that is different than the input voltage to a load. The system can also include a diode electrically coupled to the primary inductor of the transformer for generating a direct current signal from the power spike. The system can additionally include a capacitor electrically coupled to the diode to receive the direct current signal and store a charge. The system can further include a resistor electrically coupled between the capacitor and a transistor to provide an amount of charge that is stored in the capacitor to the transistor for biasing the transistor.

Example #11

The system of Example #10 may feature the primary side of the flyback converter including the diode, the capacitor, the resistor, the transistor, and a part of the transformer.

Example #12

The system of any of Examples #10-11 may feature the primary side including a second transistor. An emitter of the transistor can be electrically coupled to a drain of the second transistor.

Example #13

The system of any of Examples #10-12 may feature the capacitor including two capacitors in a voltage divider configuration. The resistor can electrically couple an output node of the voltage divider configuration to a base of the transistor.

Example #14

The system of any of Examples #10-13 may feature the transistor including a bipolar-junction transistor (BJT). The system may also feature a metal-oxide-semiconductor field effect transistor (MOSFET). An emitter of the transistor can be electrically coupled to a drain of the MOSFET.

Example #15

The system of Example #14 may feature the BJT, the MOSFET, or both including silicon carbide.

Example #16

The system of any of Examples #10-15 may feature another resistor that can be electrically coupled in parallel to the capacitor for preventing the capacitor from overcharging.

Example #17

The system of any of Examples #10-16 may feature the primary side including another diode that can be electrically coupled in parallel to the resistor for allowing an excess charge of the transistor to flow to an electrical ground.

Example #18

A method can include positioning a well tool including a flyback converter in a wellbore. The flyback converter can include a transformer magnetically coupling a primary inductor with a secondary inductor and generating a power spike in response to the primary inductor transferring an amount of energy to the secondary inductor. The flyback converter can include a diode receiving the power spike and generating a direct current signal from the power spike. The flyback converter can include a capacitor receiving the direct current signal and storing a charge associated with the direct current signal. The flyback converter can include a resistor limiting an amount of the charge stored in the capacitor that is transmitted to a transistor. The method can include causing the flyback converter to transmit a voltage to an electronic device of the well tool to operate the electronic device.

Example #19

The method of Example #18 may feature the flyback converter further including another resistor preventing the capacitor from overcharging.

Example #20

The method of any of examples #18-19 may feature the flyback converter further including another diode transmitting an excess charge from the transistor to an electrical ground.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A biasing circuit for flyback converter, the biasing circuit comprising:
   a first transistor comprising a first terminal, a second terminal, and a third terminal that is a base or a gate of the first transistor;
   a rectifier electrically coupled between (i) an inductor of the flyback converter and (ii) the first terminal of the first transistor for generating a direct current signal from an alternating current signal outputted by the inductor in response to the inductor transferring an amount of energy to another inductor;
   a storage device electrically coupled to the rectifier to receive the direct current signal and store a charge;
   a limiting device electrically coupled to the storage device to provide an amount of the charge that is stored in the storage device to the third terminal of the first transistor of the flyback converter for biasing the first transistor; and
   a second transistor electrically coupled between the second terminal of the first transistor and an electrical ground.

2. The biasing circuit of claim 1, wherein the rectifier comprises a diode, the storage device comprises a capacitor, the limiting device comprises a resistor, and the inductor comprises a part of a transformer.

3. The biasing circuit of claim 1, wherein the storage device comprises two capacitors in a voltage divider configuration, and wherein the limiting device electrically couples an output node of the voltage divider configuration to the third terminal of the first transistor.

4. The biasing circuit of claim 1, wherein the second terminal is an emitter of the first transistor that is electrically coupled to a drain of the second transistor.

5. The biasing circuit of claim 1, wherein the first transistor comprises a bipolar-junction transistor (BJT) and the second transistor comprises a metal-oxide-semiconductor field effect transistor (MOSFET), and wherein at least one of the BJT or the MOSFET comprises silicon carbide.

6. The biasing circuit of claim 1, further comprising a second limiting device that is electrically coupled in parallel with the storage device for preventing the storage device from overcharging.

7. The biasing circuit of claim 1, wherein:
   the inductor forms a portion of a transformer;
   a primary side of the flyback converter comprises the biasing circuit and is operable to receive an input voltage,
   the primary side is magnetically coupled to a secondary side of the flyback converter via the transformer, and
   the secondary side operable to transmit an output voltage that is different than the input voltage to a load comprising a sensor.

8. The biasing circuit of claim 1, wherein:
   the flyback converter comprises a primary side and a secondary side;
   the primary side comprises the rectifier, the inductor, the storage device, and the limiting device; and
   the secondary side is coupled to a load comprising an electronic device of a well tool.

9. The biasing circuit of claim 1, wherein the biasing circuit is positioned on a well tool.

10. A system for use in a wellbore, the system comprising:
    a flyback converter;
    a transformer for magnetically coupling a primary side of the flyback converter to a secondary side of the flyback converter and for generating a power spike in response to a primary inductor of the transformer transferring an amount of energy to a secondary inductor of the transformer, the primary side operable to receive an input voltage and the secondary side operable to output an output voltage that is different than the input voltage to a load;
    a first transistor comprising a first terminal, a second terminal, and a third terminal that is a base or a gate of the first transistor;
    a diode electrically coupled between (i) the primary inductor of the transformer, and (ii) the first terminal of the first transistor, wherein the diode is configured for generating a direct current signal from the power spike;
    a capacitor electrically coupled to the diode to receive the direct current signal and store a charge;
    a resistor electrically coupled between the capacitor and the first transistor to provide an amount of charge that is stored in the capacitor to the third terminal of the first transistor for biasing the first transistor; and
    a second transistor electrically coupled between the second terminal of the first transistor and an electrical ground.

11. The system of claim 10, wherein the primary side of the flyback converter comprises the diode, the capacitor, the resistor, the first transistor, and a part of the transformer.

12. The system of claim 10, wherein the primary side comprises the second transistor, and wherein the second terminal of the first transistor is an emitter that is electrically coupled to a drain of the second transistor.

13. The system of claim 10, wherein the capacitor comprises two capacitors in a voltage divider configuration, and wherein the resistor electrically couples an output node of the voltage divider configuration to the third terminal of the first transistor.

14. The system of claim 10, wherein the first transistor comprises a bipolar-junction transistor (BJT), and wherein the second transistor comprises a metal-oxide-semiconductor field effect transistor (MOSFET).

15. The system of claim 14, wherein at least one of the BJT or the MOSFET comprises silicon carbide.

16. The system of claim 10, wherein the primary side further comprises another resistor that is electrically coupled in parallel to the capacitor for preventing the capacitor from overcharging.

17. The system of claim 10, wherein the primary side further comprises another diode that is electrically coupled in parallel to the resistor for allowing an excess charge of the first transistor to flow to an electrical ground.

18. A method comprising:
  positioning a well tool comprising a flyback converter in a wellbore, the flyback converter comprising:
    a transformer magnetically coupling a primary inductor with a secondary inductor and generating a power spike in response to the primary inductor transferring an amount of energy to the secondary inductor;
    a first transistor comprising a first terminal, a second terminal, and a third terminal that is a base or a gate of the first transistor;
    a diode electrically coupled between (i) the primary inductor, and (ii) the first terminal of the first transistor, the diode being configured for receiving the power spike and generating a direct current signal from the power spike;
    a capacitor receiving the direct current signal and storing a charge associated with the direct current signal;
    a resistor limiting an amount of the charge stored in the capacitor that is transmitted to the third terminal of the first transistor; and
    a second transistor electrically coupled between the second terminal of the first transistor and an electrical ground; and
  causing the flyback converter to transmit a voltage to an electronic device of the well tool to operate the electronic device.

19. The method of claim 18, wherein the flyback converter further comprises:
  another resistor preventing the capacitor from overcharging.

20. The method of claim 18, wherein the flyback converter further comprises:
  another diode transmitting an excess charge from the first transistor to the electrical ground.

* * * * *